United States Patent [19]
Lin et al.

[11] Patent Number: 5,999,451
[45] Date of Patent: Dec. 7, 1999

[54] BYTE-WIDE WRITE SCHEME FOR A PAGE FLASH DEVICE

[75] Inventors: Jin-Lien Lin, Cupertino, Calif.; I-Long Lee, Hsinchu, Taiwan

[73] Assignee: Macronix International Co., Ltd., Hsinchu, Taiwan

[21] Appl. No.: 09/114,695

[22] Filed: Jul. 13, 1998

[51] Int. Cl.$^6$ .................................................. G11C 16/04
[52] U.S. Cl. .............................. 365/185.11; 365/185.12; 365/189.02
[58] Field of Search ...................... 365/185.11, 185.12, 365/185.13, 185.22, 185.23, 189.01, 189.02, 189.05

[56] References Cited

U.S. PATENT DOCUMENTS

| | | | |
|---|---|---|---|
| 4,054,864 | 10/1977 | Audaire | 340/473 |
| 4,656,597 | 4/1987 | Bond et al. | 364/518 |
| 4,811,294 | 3/1989 | Kobayashi et al. | 365/189 |
| 4,890,259 | 12/1989 | Simko | 365/45 |
| 5,128,569 | 7/1992 | Gladish | 310/12 |
| 5,163,021 | 11/1992 | Mehrotra et al. | 365/185 |
| 5,218,569 | 6/1993 | Banks | 365/189.01 |
| 5,245,570 | 9/1993 | Fazio et al. | 365/185 |
| 5,283,758 | 2/1994 | Nakayama et al. | 365/185 |
| 5,294,819 | 3/1994 | Simko | 257/314 |
| 5,297,081 | 3/1994 | Challa | 365/184 |
| 5,323,351 | 6/1994 | Challa | 365/218 |
| 5,357,463 | 10/1994 | Kinney | 365/185 |
| 5,363,330 | 11/1994 | Kobayashi et al. | 365/185 |
| 5,369,609 | 11/1994 | Wang et al. | 365/185 |
| 5,379,256 | 1/1995 | Tanaka et al. | 365/185 |

(List continued on next page.)

FOREIGN PATENT DOCUMENTS

| | | | |
|---|---|---|---|
| WO 95/34074 | 12/1995 | WIPO | G11C 11/56 |
| WO 95/34075 | 12/1995 | WIPO | G11C 13/00 |
| WO 96/21227 | 7/1996 | WIPO | G11C 11/40 |

OTHER PUBLICATIONS

Jung, T. et al., "A 3.3V 128Mb Multi–Level NAND Flash Memory for Mass Storage Applications", 1996 IEEE International Solid–State Circuits Conference, Digest of Technical Papers, Feb. 1996, pp. 32–33.

Bauer, M. et al., "A Multilevel–Cell 32Mb Flash Memory", 1995 IEEE International Solid–State Circuits Conference, Digest of Technical Papers, Feb. 1995, pp. 132–133.

Mills, et al., "A 3.3V 50MHz Synchoronous 16Mb Flash Memory", IEEE International Solid–State Circuits Conference, pp. 120–131, Feb. 1995.

Suh, et al., "A 3.3V 32Mb NAND Flash Memory with Incremental Step Pulse Programming Scheme", IEEE International Solid–State Circuits Conference, pp. 128–129, Feb. 1995.

Tanaka, et al., "High–Speed Programming and Progam–Verify Methods Suitable for Low–Voltage Flash Memories", IEEE Symposium on VLSI Circuits Digest of Technical Papers, pp. 61–62, (1994).

Kobayashi, S. et al., "A 3.3V Only 16Mb DINOR Flash Memory", ULSI Laboratory, Mitsubishi Electric Corp. Japan, Nov. 1997, 13 pages.

*Primary Examiner*—David Nelms
*Assistant Examiner*—Anh Phung
*Attorney, Agent, or Firm*—Haynes & Beffel LLP

[57] ABSTRACT

In a floating gate memory that has a buffer that can be coupled to a set of floating gate memory cells in the memory, a method of writing to a selected portion of the set of floating gate cells. For example, a method of writing a byte to a floating gate memory where the memory uses a page buffer reads and writes to an entire row of cells at a time. Store contents of the set of floating gate cells into the buffer, store the data into a portion of the buffer corresponding to the selected portion of the set of floating gate cells, and store contents of the buffer into the set of floating gate cells. An improved floating gate memory is disclosed in which data may be loaded into a portion of the floating gate cells in a set of cells that may be coupled to a buffer.

44 Claims, 9 Drawing Sheets

U.S. PATENT DOCUMENTS

| | | | |
|---|---|---|---|
| 5,414,658 | 5/1995 | Challa | 365/185 |
| 5,418,743 | 5/1995 | Tomioka et al. | 365/189.01 |
| 5,422,845 | 6/1995 | Ong | 365/185 |
| 5,450,363 | 9/1995 | Christopherson et al. | 365/205 |
| 5,526,307 | 6/1996 | Yiu et al. | 365/185.01 |
| 5,559,717 | 9/1996 | Tedrow et al. | 364/483 |
| 5,563,822 | 10/1996 | Yiu et al. | 365/185.14 |
| 5,615,149 | 3/1997 | Kobayashi et al. | 365/185.12 |
| 5,625,590 | 4/1997 | Choi et al. | 365/185.17 |
| 5,638,326 | 6/1997 | Hollmer et al. | 365/185.2 |
| 5,646,886 | 7/1997 | Brahmbhatt | 365/185.16 |
| 5,748,535 | 5/1998 | Lin et al. | 365/185.22 |
| 5,751,637 | 5/1998 | Chen et al. | 365/185.33 |
| 5,754,469 | 5/1998 | Hung et al. | 365/185.03 |
| 5,835,414 | 11/1998 | Hung et al. | 365/185.25 |

BYTE-WIDE WRITE SCHEME FOR A PAGE FLASH DEVICE

BACKGROUND

1. Field of the Invention

The invention relates to integrated circuit memory devices based on floating gate transistor technology; and more particularly to schemes for writing to a selected portion of a page mode flash memory.

2. Description of Related Art

Flash memory is a growing class of non-volatile storage integrated circuit based on floating gate transistors. The memory cells in a flash device are formed using so called floating gate transistors in which the data is stored in a cell by charging or discharging the floating gate. The floating gate is a conductive material, typically polysilicon, which is insulated from the channel of the transistor by a thin layer of oxide, or other insulating material, and insulated from the control gate of the transistor by a second layer of insulating material.

To store data in a floating gate memory cell, the floating gate is charged or discharged using a Fowler-Nordheim tunneling mechanism, or a hot electron injection mechanism. The Fowler-Nordheim tunneling mechanism is executed by establishing a large positive (or negative) voltage between the gate and source or drain of the device. This causes electrons to be injected into (or out of) the floating gate through the thin insulator. The hot electron injection mechanism is based on an avalanche process. Hot electron injection is induced by applying potentials to induce high energy electrons in the channel of the cell, which are injected across the thin insulator into the floating gate. To induce hot electron injection, a potential is applied across the source and drain of the device, along with a positive potential on the control gate. The positive potential on the control gate tends to draw electrons from the current in the channel of the device into the floating gate.

The acts of charging and discharging the floating gate in a floating gate memory device are relatively slow compared to writing other memory types, like static or dynamic random access memory, and limit the speed with which data may be written into the device.

Another problem associated with floating gate memory devices arises because the charging and discharging of the floating gate is difficult to control over a large array of cells. Thus, some of the cells program or erase more quickly than others in the same device. In a given program or erase operation, not all the cells subject of the operation will settle with the same amount of charge stored in the floating gate. Thus, so called program verify and erase verify sequences have been developed to efficiently ensure that the memory is being accurately programmed and erased. The program and erase verify operations are based on comparing the data stored in the floating gate memory array with the intended data. The process of comparing data is relatively time consuming, involving sequencing byte by byte through the programmed or erased cells. If a failure is detected in the verify sequence, then the program or erase operation is retried. Program retries are typically executed word-by-word or byte-by-byte in prior art devices. Thus, bits successfully programmed in a byte with one failed bit are subject to the program cycle repeatedly. This can result in over-programming and failure of the cell. One approach to resolving this issue is set forth in U.S. Pat. No. 5,163,021, entitled *Multi-State EEPROM Read And Write Circuits and Techniques*, by Mehrotra To improve the efficiency of program and program verify operations, so called page mode flash devices have been developed. In these devices, a page buffer is associated with the memory array. The page buffer includes a set of bit latches, one bit latch associated with each global bit line in the array. To program a page in the array, the page buffer is loaded with the data to be programmed, by transferring the program data into the bit latches of the page buffer. The program operation is then executed on the bit lines controlled by the contents of the bit latches. The verify procedure is based on clearing automatically all of the bit latches in the page buffer which are successfully programmed in a parallel operation. The page buffer is then read to confrrm that all bits have been cleared, indicating a successful program operation.

The page mode program process is described for example in commonly owned prior PCT Patent application entitled *Advanced Program Verzi For Page Mode Flash Memory*, filed Jan. 5, 1995, Application No. PCT/US95/00077. In this application, the program verify operation relies on the sense amplifiers in the memory, which are limited in number, typically to 16, to sense the state of the memory cells being programmed. If the cell is programmed to the proper state, then the bit latch is reset based on the sense amplifier output. The sense amplifier is used because of charge sharing issues which arise from attempting to sense the level of bit lines in the memory array by a latch structure. The bit latch structure typically requires a significant current to reliably reset the latch. The sense amplifier circuit is able to provide sufficient current to reset the bit latch, while the bit line current through the memory cells is normally low due to the small geometry of the cells. Another page mode programing device is described in U.S. Pat. No. 5,615,149, entitled *Non-Volatile Semiconductor Memory Device Incorporating Data Latch And Address Counter For Page Mode Programming*, by Kobayashi.

A problem with some prior page mode devices is that the devices require erasing and programming cells in an entire page or sector in order to change the contents of any of the cells in the page or sector. In such a device, it is not possible to address and program a portion of the cells of the page or sector. It may be desirable, however, to program only a portion of the cells of the page or sector. Thus, an improved flash memory which allows writing a portion of the cells in a page in page mode device is desirable.

SUMMARY OF THE INVENTION

In a floating gate memory that has a buffer that can be coupled to a set of floating gate memory cells in the memory, the invention provides a method of writing to a selected portion of the set of floating gate cells. For example, according to a unique aspect of the invention, the invention provides a method of writing a byte to a floating gate memory where the memory uses a page buffer reads and writes to an entire row of cells at a time. The method includes storing contents of the set of floating gate cells into the buffer, storing the data into a portion of the buffer corresponding to the selected portion of the set of floating gate cells, and storing contents of the buffer into the set of floating gate cells. Thus, the invention provides an improved floating gate memory in which data may be loaded into a portion of the floating gate cells in a set of cells that may be coupled to a buffer. This provides improved flexibility over systems in which memory can be written only one whole page at a time.

According to other aspects of the invention, the data comprises at least 4 bits and not more than 128 bits. The set of cells that can be coupled to the buffer comprises at least 500 bits according to another aspect of the invention.

According to another aspect of the invention, the buffer comprises static random access memory (SRAM). In an embodiment of the invention, the buffer may comprises bit latches coupled to respective bit lines and the set of floating gate cells includes a row of floating gate cells.

In an aspect of the invention, storing the contents of the row into the buffer comprises setting a set of bit lines to a pre-charge voltage level, applying a word line voltage to a word line of the row, and responding to changes in voltage levels of the bit lines in response to the word line voltage, to store a constant in the bit latches coupled to the bit lines on which the voltage levels of the bit lines passes a threshold during the step of applying the word line voltage.

In another aspect of the invention, storing contents of the buffer into the row comprises erasing the row, applying a word line voltage to a word line of the row, and applying a programming potential to a set of bit lines in response to one binary value in the bit latches, but not the other binary value. According to another aspect of the invention, the method includes verifying that the row has been successfully programmed.

Another aspect of the invention includes storing the data into a register coupled to the buffer, wherein the storing the data into a portion of the buffer comprises causing the data in the register to be stored into the buffer.

The invention can also be characterized as, in an array of floating gate memory cells including bit lines coupled with corresponding columns of cells in the array, word lines coupled with corresponding rows of cells in the array, and bit latches coupled with respective bit lines, a method of loading data into a selected portion of row in the array, the method comprising storing contents of the row of floating gate cells into the bit latches, storing the data into a set of the bit latches corresponding to the selected portion of the row in the array of floating gate cells, and storing contents of the bit latches into the row in the array of floating gate cells. In one embodiment, the row of floating gate cells comprises at least 500 cells and the data comprises not more than 256 bits.

According to an aspect of the invention, before the storing the data into the set of bit latches, the data is stored into a register coupled to the bit latches by causing the data in the register to be stored into bit latches corresponding to the selected portion of the row. Causing the data in the register to be stored into bit latches corresponding to the selected portion of the row comprises coupling a multiplexer between the register and the bit latches and applying to the multiplexer a portion of an address of the selected location in the array, the portion of the address corresponding to the selected portion of the row.

According to another aspect of the invention, storing contents of the row into the bit latches comprises resetting a bit line address and setting a word line corresponding to the row. Storing contents of the bit latches into the row comprises erasing the row and programming cells in the row based on contents of the bit latches. Programming the row based on contents of the bit latches, according to another aspect of the invention, comprises applying a programming potential to the bit lines in response to the contents of the bit latches. The programming potential, according to a unique aspect of the invention, comprises greater than 5 volts.

In another embodiment of the invention, applying a programming potential comprises providing pass transistors, having gate terminals, between a supply of the programming potential and the bit lines, and connecting outputs of respective bit latches to gate terminals of the pass transistors.

Applying a programming potential includes first applying the programming potential to bit lines in a first set of bit lines among the bit lines, and then applying the programming potential to bit lines in a second set of bit lines among the bit lines. Bit lines in the first set of bit lines comprise every other bit line and bit lines in the second set of set of bit lines comprise the remaining bit lines.

Storing contents of the bit latches into the row further comprises, according to a unique aspect of the invention, verifying that the row has been programmed according to the contents of the bit latches and if the row has not been programmed according to the contents of the bit latches, then reprogramming the row based on the contents of the bit latches.

The invention can also be characterized as a method of loading a byte into an array at a particular address in an array of floating gate memory cells including a buffer which can be coupled with respective sets of bytes of the array. The method includes storing the byte into a register, storing a set of bytes from a portion of the array into the buffer, the portion of the array corresponding to a part of the address, storing the byte from the register into a location of the buffer, the location corresponding to another part of the address and storing contents of the buffer into the portion of the array.

According to an aspect of the invention, the portion of the array comprises a row of cells, the array includes word lines coupled to respective rows of cells, the set of bytes comprises a row of cells, and storing the set of bytes from a portion of the array comprises applying a word line voltage to a word line corresponding to the row of cells.

The invention can also be characterized as an integrated circuit comprising an array of floating gate memory cells. The array includes bit lines coupled with corresponding columns of cells in the array, word lines coupled with corresponding rows of cells in the array; and bit latches coupled with respective bit lines. Respective rows include pluralities of bytes. The array includes a register including at least a byte of storage and less storage than the bit latches and a multiplexer coupled to the register and the bit latches. The array further includes circuitry to control the word lines, the bit latches, and the multiplexer to store data into the register, to select a row of the array, to store the selected row from the array into the bit latches, to store the data from the register into selected bit latches from among the bit latches, and to store contents of the bit latches into the selected row of the array.

The integrated circuit, according to an aspect of the invention, includes circuitry to erase cells in the selected row of the array and circuitry to program particular cells in the selected row of the array based on contents of the bit latches. In an embodiment of the invention, the circuitry to program particular cells in the selected row of the array comprises circuitry to apply a programming potential to bit lines among the bit lines in the array in response to the contents of the bit latches. The programming potential comprises greater than 5 volts, according to another unique aspect of the invention.

DETAILED DESCRIPTION

A detailed description of embodiments of the present invention is provided with reference with FIGS. 1–9. The embodiments disclosed are not intended to be exhaustive as to limit the invention to the precise forms discussed.

Some floating gate memory arrays are provided with a buffer, such as a page buffer or other set of bit latches, that allow for the reading and writing of sets of floating gate cells in the memory. For example, a floating gate memory may have a page buffer that can be coupled to a row of floating gate cells in a floating gate cell array. Such a floating gate memory may require writing the entire page of memory, even though it may be desirable to write only a selected portion of the page, such as a single byte. An improved method is disclosed here that allows writing data to less than the set of floating gate cells that may be coupled to the buffer. First, contents of the page, row, or set of cells into which the data is to be written are stored into the buffer. Next, the data is stored into a selected portion of the buffer. The selected portion of the buffer corresponds to the location in the page, row, or other set of cells where the data is to be stored. Finally, the contents of the buffer are stored into the page, row, or other set of cells in the array.

Figure 1:
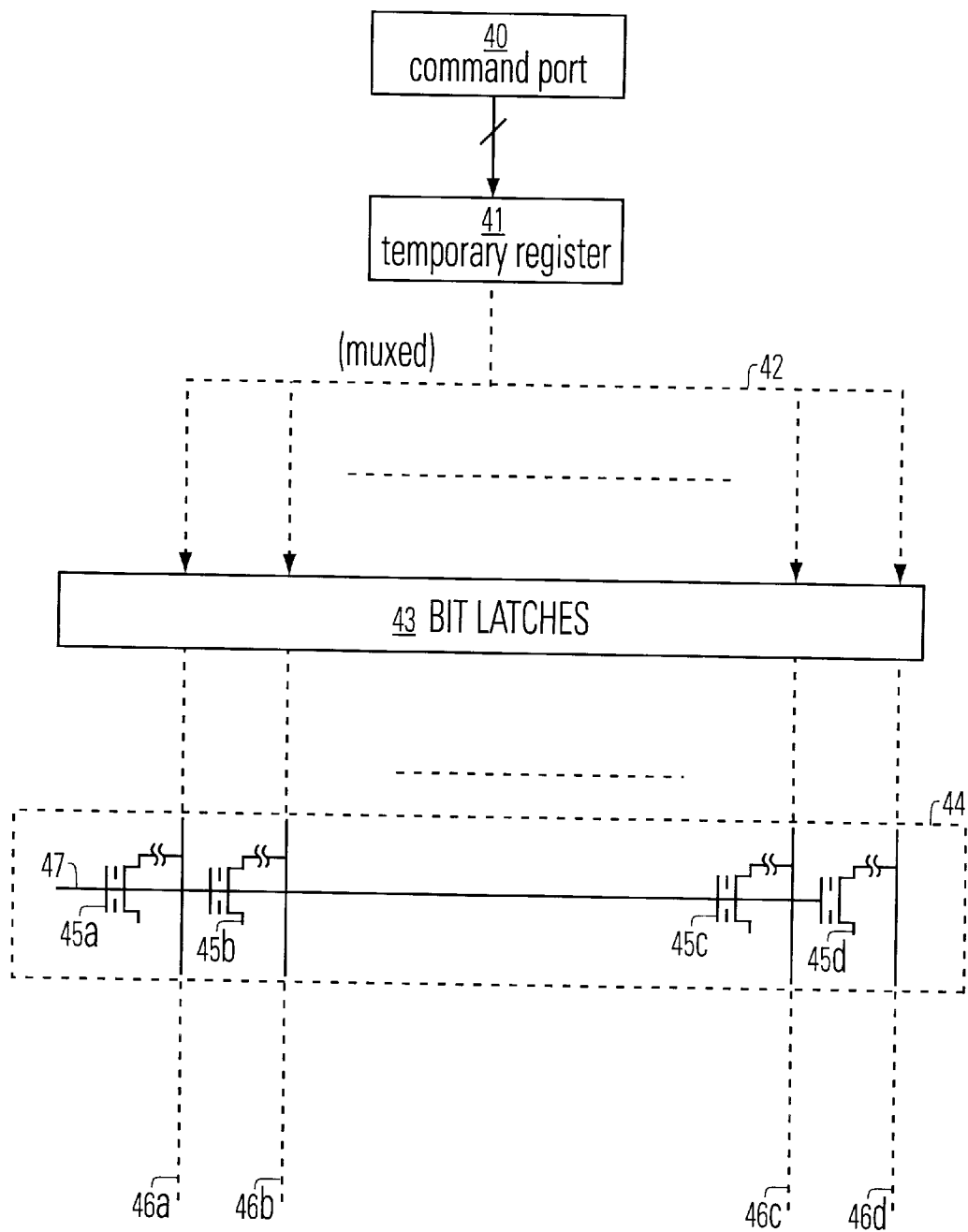
FIG. 1 is a simplified block diagram of a floating gate memory integrated circuit of the invention.

FIG. 1 is a simplified block diagram of a floating gate memory integrated circuit of the invention. FIG. 1 shows a command port 40, temporary register 41, multiplexed inputs 42, bit latches 43, bit lines 46a, 46b, 46c, and 46d, and a row of floating gate memory cells 44, which includes floating gate memory cell 45a, 45b, 45c, and 45d. Row 44 also includes word line 47.

Bit latches 43 are coupled to floating gate memory cells of row 44 via bit lines 46a, 46a, 46c, and 46d. These bit lines are coupled to bit latches 43 and to floating gate cells 46a–d in row 44 as well as to floating gate cells in other rows. A row is selected by selecting the word line of the row. For example, row 44 is selected via word line 47.

To load data into the floating gate memory, first data is loaded via command port 40 into the integrated circuit. From command port 40, the data is loaded into temporary register 41, which is coupled to command port 40. Before loading the data from the temporary register into the bit latches, first contents of row 44 are loaded into bit latches 43. Row 44 is selected via word line 47. Loading contents of row 44 into bit latches 43 allows for the data from temporary register 41 to be loaded into bit latches 43 without requiring the entire row to be written from the command port into bit latches 43. Now that bit latches have the contents of row 44 of the array, the data from temporary register 41 is loaded into a particular location in bit latches 43 that corresponds to the location in row 44 where the data is to be stored. The data from temporary register 41 is multiplexed over multiplexed inserts 42 into bit latches 43. Multiplexing the data from temporary register 41 into bit latches 43 allows the data to be inserted into particular bit latches among bit latches 43. Next, contents of bit latches 43, which includes the data from temporary register 41, are loaded into row of floating gate cells 44. Row 44 is selected via word line 47 to load contents of bit latches 43 into row 44.

Loading data into cells of the floating gate memory may include a series of steps. For example, after loading contents of row 44 into bit latches 43, then row 44 is erased. Then, when the contents of bit latches 43 are loaded into row 44, only cells that need to be programmed based on contents of bit latches 43 are programmed. Other cells are already in the correct state because they have erased. Also an erase verify sequence may be performed after erasing contents of rows 44 and a program verify sequence may be performed after loading contents of bit latches 43 into row 44. Bit latches 43 may not be tied directly to bit lines 46a–d. Instead, bit latches 43 may be coupled to bit lines through pass transistors or through some other indirect means.

Figure 2:
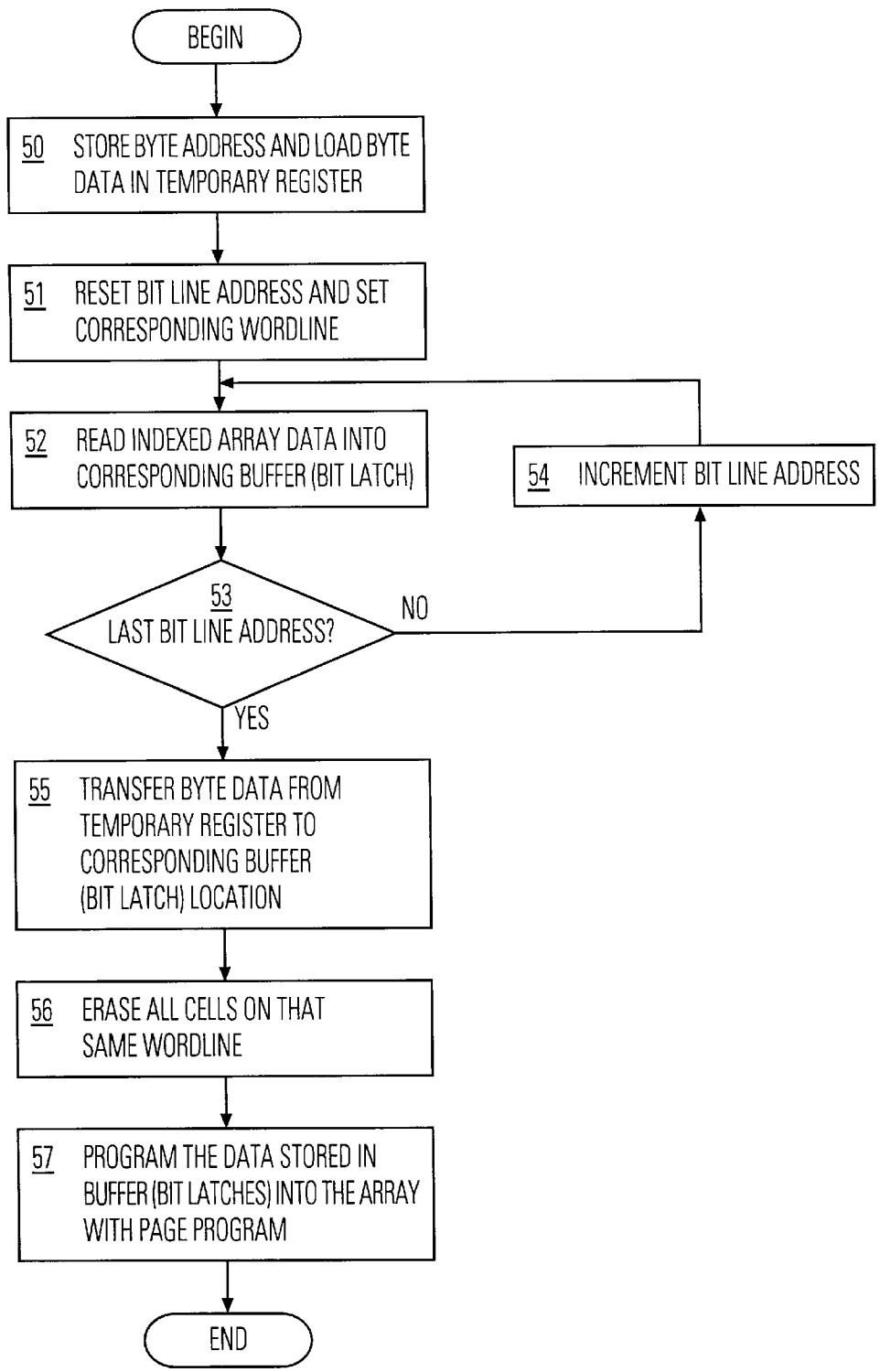
FIG. 2 is a flow chart of a method of a byte wide writing into flash memory according to the invention.

FIG. 2 is a flow chart of a method of byte wide writing into flash memory according to the invention. First, the byte address is stored and the byte data is loaded into temporary register 50 (block 50). This byte is the data to be loaded into the row and is a smaller amount of data than what can be loaded in the page buffer. Next, the bit line address is reset and the corresponding word line is set (block 51). Setting the word line thus selects a row of the array. Next, indexed array data is read into the corresponding buffer (bit latch) (block 52). This causes data currently stored in the row to be loaded into the buffer so that it does not need to be reloaded from an external source. This is performed incrementally for each bit line address as shown in decision block 53, which checks for last bit line address, and block 54, which increments the bit line address if this is not the last bit line address. From block 54, proceed back to block 52, to continue reading indexed array data into the corresponding buffer (bit latch). In this manner, contents of the row of the array are stored into the buffer.

Once the last bit line address has been completed, proceed to block 55, and transfer byte data from temporary register to corresponding buffer (bit latch) location. The corresponding location is the location in the buffer which corresponds to the location in the row where the data is to be stored. For example, if the data is to be loaded into a particular address in the floating gate memory array, a portion of that address may be used to select the row in which the data is to be loaded. Thus, this portion of the address may be used to select a particular word line in the array. Another portion of the address may be used then to select a particular location within the row in which to store the data. Thus, this other portion of the address may be used to index, eg., via a multiplexer, into the buffer. In this manner, the data is stored into a location in the buffer that corresponds to a location in the array in which the data is to be stored. Next, erase all cells on that same word line (block 56). Thus, now that the contents of the row have been loaded into the buffer, the row itself in the array is erased so that it will be ready for the modified contents of the bit latches to be loaded back into the row. Next, program the data stored in the buffer (bit latches) into the array with page program (block 57). Thus, the modified row contents are loaded back into the row. Erasing cells in the row and programming cells according to the data stored in the buffer may involve particular sequences in order to verify erase and programming of cells. For example, an erase verify sequence may be executed as well as a program verify sequence. These sequences may involve re-erasing or reprogramming cells that did not erase or program correctly. For a discussion of verifying erase and program of floating gate memory cells, refer to U.S. Patent Application entitled *Page Mode Program, Program Verfy, Read and Erase Verify for Floating Gate Memory Device with Low Current Page Buffer*, Application Ser. No.: 08/718,334, filed Oct. 1, 1996, and invented by Chung-Hsiung Hung, et al., which is incorporated herein by reference. Further discussion on flash EPROMs and programming of flash EPROMs, referred to the following patents, which are incorporated herein by reference: U.S. Pat. No. 5,563,822, entitled *Fast Flash EPROM Programming And Pre-Programming Circuit Design*, invented Yiu, et al. and U.S. Pat. No. 5,526,307, entitled *Flash EPROM Integrated Architecture*, invented by Yiu, et al.

Additionally, cells in the floating gate memory may be programmed by storing multiple bits per cell. For a description of storing multiple bits per cell in a floating gate memory device, refer to U.S. Patent Application entitled *Page Mode Floating Gate Memory Device Storing Multiple Bits Per Cell*, application Ser. No.: 08/718,335, filed Jun. 14, 1996, invented by Hung, et al., which is incorporated herein by reference.

Figure 3:
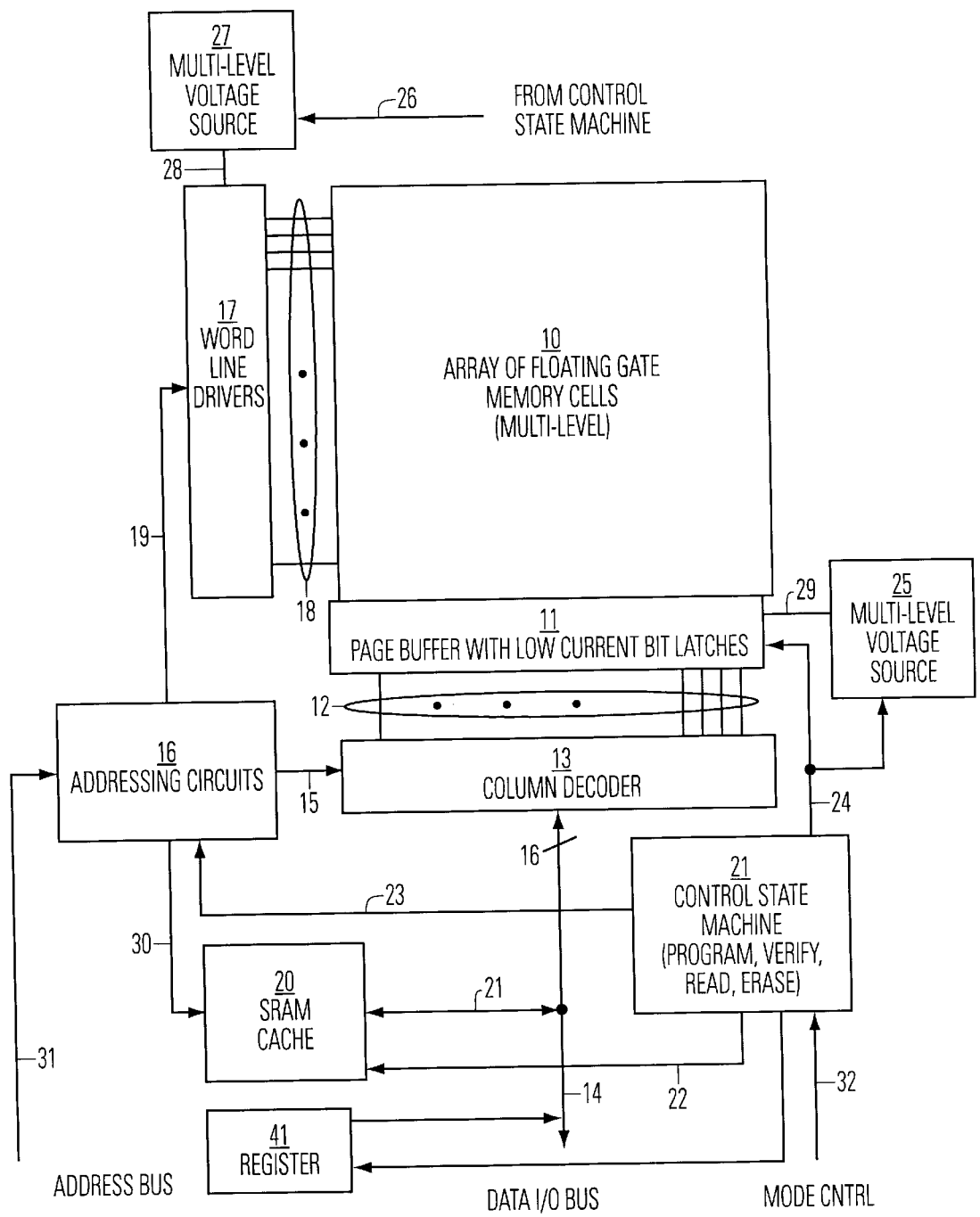
FIG. 3 is a basic block diagram of a floating gate memory integrated circuit according to the present invention.

FIG. 3 is a block diagram of an integrated circuit memory including an array 10 of floating gate memory cells. A page buffer 11 with low current bit latches is coupled to the array 10 of floating gate memory cells. The low current bit latches in the page buffer 11 are coupled to respective bit lines in the set 12 of bit lines which pass through the array 10 of floating gate memory cells. The set 12 of bit lines is coupled to a column decoder 13 for selecting subsets of the set of bit lines onto a data input/output bus 14. Register 41 is coupled to page buffer 11 via input/output bus 14 and column decoder 13. Register 41, which corresponds to temporary register 41 of FIG. 1, allows for writing of data smaller than the size of page buffer 11 into array 10. In one example, the data input/output bus 14 is 16 bits wide (2 bytes) and the set 12 of bit lines is 1K (1024) bits (128 bytes) wide. Thus, the column decoder 13 will select 16 bit lines in the set 12 of bit lines onto the data input/output bus 14 at a time in response to addressing signals supplied across line 15 from addressing circuits 16 on the device. Also coupled to the array 10 of floating gate memory cells is a set of word line drivers 17 which drive a set 18 of word lines in the array 10 of floating gate memory cells. The word line drivers select particular rows of cells response to addressing signals supplied on line 19 from the addressing circuits 16 of the device. Optionally, an SRAM cache 20 is included on the integrated circuit memory. The SRAM cache 20 is connected across line 21 to the data input/output bus 14, and acts as a cache (also called a buffer) for storing and reading data for the array 10 of floating gate memory cells. Thus, data is transferred into the cache 20, and from the cache 20 into the array 10 of floating gate memory cells, and vice versa in order to provide a flexible input/output interface for the integrated circuit memory.

The integrated circuit memory also includes a control state machine 21 which supplies control signals on line 22 to the SRAM cache 20, control signals on line 23 to the addressing circuits 16, control signals on line 24 to the page buffer 11 and to a multi-level voltage source 25 connected to the page buffers across line 29. Also, control signals are supplied from the control state machine on line 26 to a multi-level voltage source 27 which is coupled to the word line drivers 17 across line 28.

Control state machine 21 helps to load data into array 10 including data that is smaller than the size of page buffer 11. Control state machine 21 causes the data to be loaded into register 41. Control state machine also activates addressing circuits 16 based on at least part of an address corresponding to the location where the data is to be loaded into the array. Based on the address into which the data is to be loaded into array 10, word line drivers 17 are activated selecting a row in array 10 in which the data is to be stored. Control signals cause contents of the row to be loaded into page buffer 11. Control signals subsequently cause contents of the row in the array to be erased. Erasing the row is followed by an erase verify and re-erase sequence.

Control signals cause data from register 41 to be loaded into a selected portion of page buffer 11. The selected portion is determined based on the address at which the data from register 41 is to be loaded in the array 10. For example, an address may specify that the data is to be loaded into floating gate cells on a particular row at particular columns. The columns are determined by bit lines. In this example, a portion of the address corresponds to the row and indicates the word line that is to be activated in order to access the contents of that row. Also in this example, another portion of the address specifies the particular cells within that row into which the data is to be loaded. Thus, control circuitry uses one portion of the address to determine a word line to activate in order to select a row, and another portion of the address to determine which portion of the buffer into which the data is to be loaded. By loading the data into a particular portion of the buffer, then, when the buffer is loaded back into the row, the data will be loaded into the selected portion of the row. After causing the data to be loaded into the proper location of page buffer 11 from register 41, control signals cause contents of page buffer 11 to be loaded back into the selected row in array 10. Control state machine 21 causes erase of contents of the row and loading contents of page buffer 11 into array 10 to take place according to page mode erase and verify operations and page mode program and program verify operations. Also, when contents of the row are first loaded into page buffer 11, control state machine causes this to occur according to page mode read.

The SRAM cache 20 is responsive to addressing signals on line 30 from the addressing circuits 16, and control signals on line 22 from the control state machine 21 to act cooperatively with the input/output operations for the array 10 of floating gate memory cells.

Addresses are supplied to the integrated circuit memory on address bus 31. The address bus 31 is coupled to the addressing circuits 16. The addressing circuits generate addressing signals for the word line drivers 17, the column decoder 13, and the SRAM cache 20.

Also, mode control inputs are supplied on line 32 to the control state machine 21. The mode control inputs on line 32 may be supplied from an external source to the integrated circuit memory, or may be generated by decoding address and data lines, as is known in the art.

The control state machine 21 executes processes for page mode program, page mode program verify, page mode read, and page mode erase verify operations, in a manner which takes advantage of the low current bit latches in the page buffer 11. These processes can be understood better after a description of a floating gate memory array and page buffer architecture as provided below with reference FIGS. 4–6.

Figure 4:
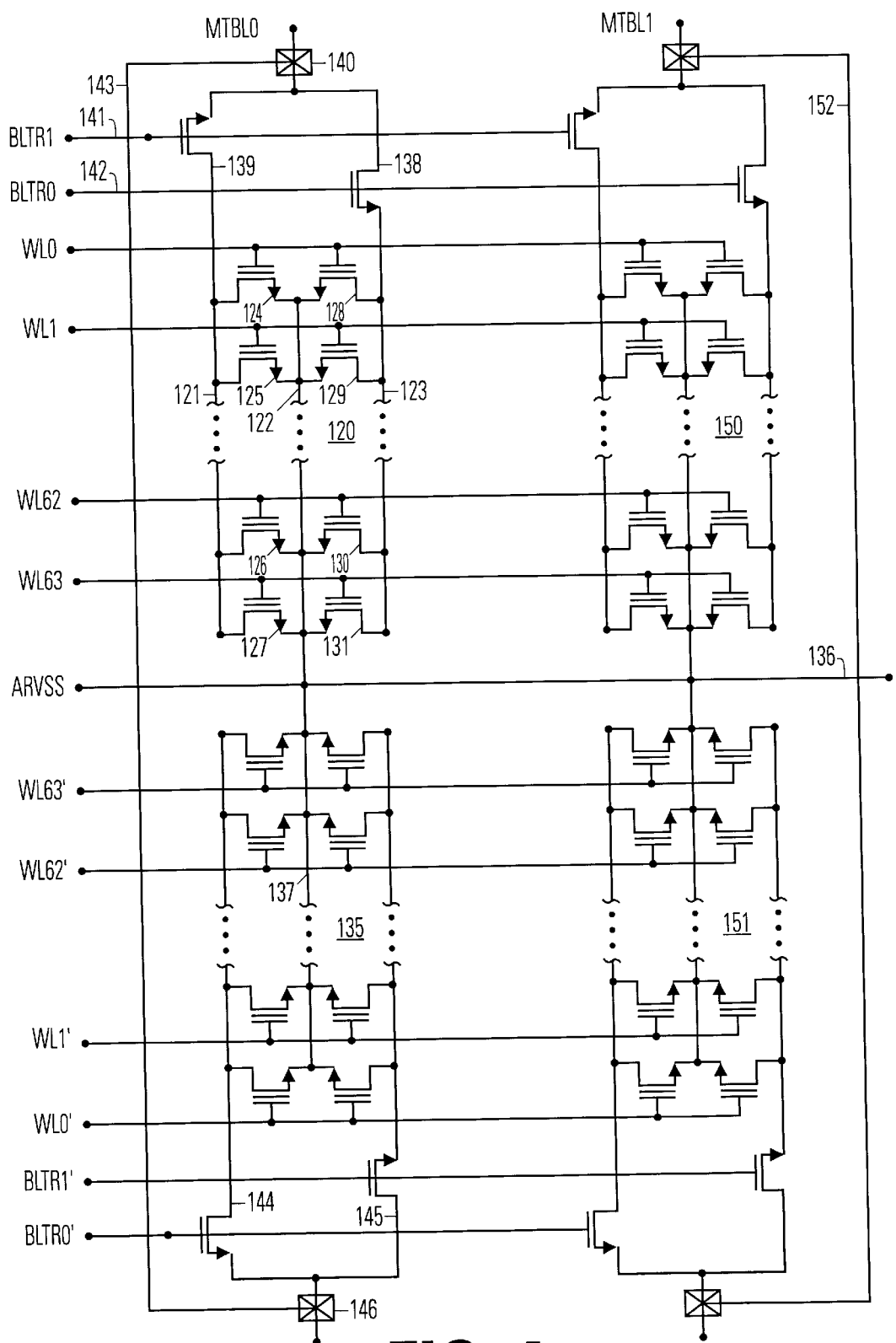
FIG. 4 is a diagram of a floating gate memory array architecture, suitable for use with the present invention.

FIG. 4 illustrates a flash EEPROM array architecture, in which two columns of flash EEPROM cells share a single metal bit line. FIG. 4 shows four pairs of columns of the array, where each pair of columns includes flash EEPROM cells in a drain-source-drain configuration.

Thus, the first pair 120 of columns includes a first drain diffusion line 121, a source diffusion line 122, and a second drain diffusion line 123. Word lines WL0 through WL63 each overlay the floating gates of a cell in a first one of the pairs of columns and a cell in the second one of the pairs of columns. The first pair 120 of columns includes one column including cell 124, cell 125, cell 126, and cell 127. Not shown are cells coupled to word lines WL2 through WL61. The second column of the first pair 120 of columns includes cell 128, cell 129, cell 130, and cell 131. Along the same column of the array, a second pair 135 of columns is shown. It has a similar architecture to the pair 120 of columns except that it is laid out in a mirror image. Also, the second pair 135 of columns is connected to the same metal bit line MTBL0 as the first pair 120.

Thus, a cell in the first one of the pair of columns, such as the cell 125, includes a drain in drain diffusion line 121, and a source in the source diffusion line 122. A floating gate overlays the channel region between the first drain diffusion line 121 and the source diffusion line 122. The word line WL1 overlays the floating gate of the cell 125 to establish a flash EEPROM cell.

The column pair 120 and column pair 135 share an array virtual ground diffusion 136 (ARVSS). Thus, the source diffusion line 122 of column pair 120 is coupled to the ground diffusion 136. Similarly, the source diffusion line 137 of column pair 135 is coupled to the ground diffusion 136.

As mentioned above, each pair 120 of columns of cells shares a single metal line. Thus, a block right select transistor 138 and a block left select transistor 139 are included. The transistor 139 includes a drain in the drain diffusion line 121, a source coupled to a metal contact 140, and a gate coupled to the control signal BLTR1 on line 141. Similarly, the right select transistor 138 includes a source in the drain diffusion line 123, a drain coupled to the metal contact 140, and a gate coupled to the control signal BLTR0 on line 142. Thus, the select circuitry, including transistors 138 and 139, provides for selective connection of the first drain diffusion line 121 and a second drain diffusion line 123 to the metal line 143 (MTBL0) through metal contact 140. As can be seen, column pair 135 includes left select transistor 144 and right select transistor 145 which are similarly connected to a metal contact 146. Contact 146 is coupled to the same metal line 143 as is contact 140 which is coupled to column pair 120. The metal line can be shared by more than two columns of cells with additional select circuitry.

The architecture shown in FIG. 4 is based upon a drain-source-drain unit forming two columns of cells which are isolated from adjacent drain-source-drain units to prevent leakage current from adjacent columns of cells. The architecture can be extended to units of more than two columns, with appropriate tolerances for leakage current in the sensing circuitry, or other controls on current leakage from unselected cells. Thus, for instance, fourth and fifth diffusion lines could be added within a given isolated region to create a drain-source-drain-source-drain structure which provides four columns of cells.

Column pairs are laid out horizontally and vertically to provide an array of flash EEPROM cells comprising M word lines and 2N columns. The array requires only N metal bit lines each of which is coupled to a pair of columns of flash EEPROM cells through select circuitry, as described above.

Although the figure only shows four column pairs 120, 135, 150, and 151, coupled to two metal bit lines 143 and 152 (MTBL0–MTBL1), the array is repeated horizontally and vertically as required to establish a large scale flash EEPROM memory array. Thus, column pairs 120 and 150 which share a word line are repeated horizontally to provide a segment of the array. Segments are repeated vertically. A group of segments (e.g., eight segments) having respective word lines coupled to a shared word line driver may be considered a sector of the array.

In a preferred system, 1024 metal bit lines are shared by 2048 columns of cells. The 1024 metal bit lines are connected to respective bit latches in the page buffer. The bit latches store a control bit for each metal bit line, used for verify program, verify, read and erase verify operations as discussed in more detail below.

Figure 5:
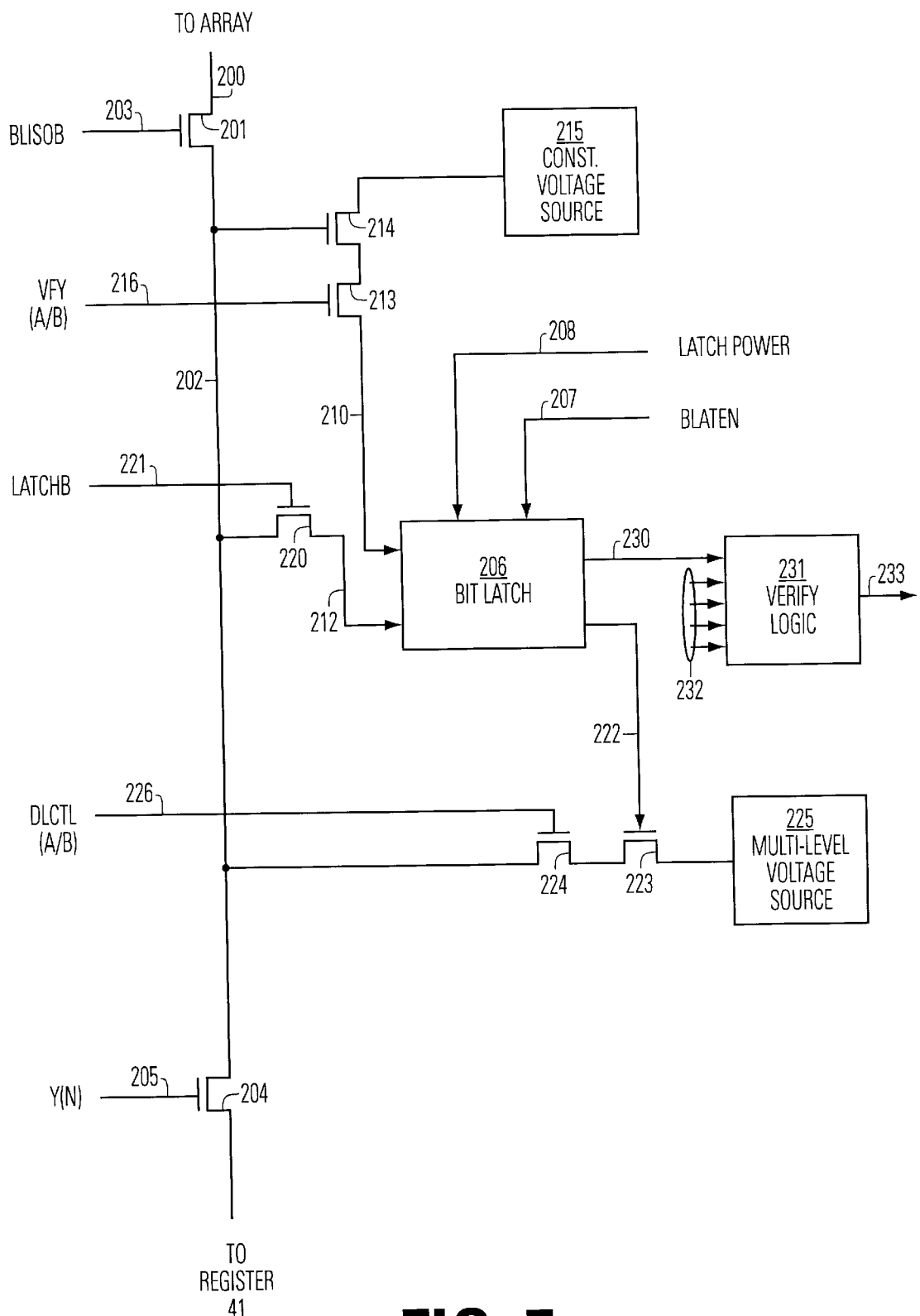
FIG. 5 is a simplified diagram of the bit latch structure according to the present invention.

FIG. 5 illustrates the basic structure of a bit line control element, including bit latch 206 in the page buffer 11 for an integrated circuit memory such as that described in FIG. 3. Thus, FIG. 5 includes a bit line 200 which corresponds for example to a metal bit line MTBL0 in the architecture of FIG. 4. The bit line 200 is connected to a pass transistor 201 which is used for the purpose of isolating a bit line segment 202 within the page buffer from the metal bit line 200 of the array. Pass transistor 201 is controlled by a control signal BLISOB on line 203. The bit line segment 202 within the page buffer is coupled to column select circuits represented by pass gate 204. The column select pass gate 204 is controlled by a column select signal Y(N) on line 205, where N goes from 0 to 63 in a set of 1K bit lines using a 16 bit input/output bus.

The page buffer consists of a sequence of bit line control elements, associated with respective bit lines. Each bit line control element includes a bit latch 206 coupled with the bit line 200. The bit latch 206 in a preferred system is implemented with an SRAM type memory element composed of opposing inverters as known in the art. The bit latch 206 has an enable input supplied on line 207 which receives the signal BLATEN. The power used by the bit latch 206 is supplied on line 208. As illustrated in the figure, a signal LATCH POWER is supplied on line 208 which sets the power level of the bit latch 206. Typically this power level will correspond to the VDD voltage in the device. However it is controlled during various operations as discussed below.

The bit latch 206 has two data inputs. The first data input is received on line 210, and the second data input is received on line 212. The first data input on line 210 is coupled to a pass gate structure including a first pass transistor 213 and a second pass transistor 214 connected in series. On the opposite end of pass transistor 214, a constant voltage source 215 is connected. The gate of pass transistor 214 is coupled to the bit line segment 202. The gate of the pass transistor 213 is coupled to a verify control signal VFY (A,B) on line 216. In one embodiment, there are two (or more) verify control signals (A and B) for strobing separate sets of bit latches. In this embodiment, every other bit line receives VFY(A) and the remaining bit lines receive VFY(B).

The second input on line 212 to the bit latch 206 is supplied through pass transistor 220 from the bit line segment 202 which is separated from the main bit line 200 by the pass transistor 201. The gate of pass transistor 220 is connected to line 221 which receives the control signal LATCHB.

Bit latch 206 has output 222. The output 222 is connected as a control input to a pass gate composed of pass transistor 223 and pass transistor 224 connected in series between a multi-level voltage source 225, and the bit line segment 202. The output on line 222 of the bit latch 206 is connected to the gate of pass transistor 223. The gate of pass transistor 224 is connected on line 226 to a data line control signal DLCTL (A,B). In one embodiment, there are two (or more)

data line control signals (A and B) separately sensing sets of bit latches in a read mode in coordination with the two VFY (A,B) signals.

The bit latch 206, is configured so that it has a very low impact on the bit line 200, in the terms of current consumption, and so that the current requirements of the bit latch do not fight against the current requirements of the bit line 200 during page mode operations. With a low current bit latch, a wide variety of efficient page mode processes are implemented.

Thus, the first input 210 provides a circuit by which the bit latch 206 is loaded with a constant value in response to a change in the voltage level on the bit line 202 to a determinate level low enough to turn on the pass transistor 214. Thus for example if the constant voltage source is VDD, the pass transistor 214 is implemented as a p-channel device. If the voltage level on the bit line 202 is low, when the control signal VFY on line 216 is strobed, then the constant will be loaded from the constant voltage source 215 into the bit latch 206, without consuming current on the bit line 202.

If the constant voltage source 215 is ground, then the pass transistor 214 is implemented with an n-channel device, along with other modifications, and reacts to a high voltage level on the bit line 202 to cause the constant to be loaded into the bit latch 206.

The input 212 to the bit latch 206 is connected to a second circuit which is controlled by the control signal LATCHB on line 221 to load a data value supplied on the bit line segment 202. This path is utilized primarily for loading data through the column select transistor 204 into the bit latch 206, which can be driven by relatively high current data source. This input however is disabled during sensing of the voltage level on the bit line 200.

The output on line 222 of the bit latch is connected to a third circuit which is utilized to transfer a selected voltage level from the multi-level voltage source 225 onto the bit line segment 202 in response to the control bit stored in the bit latch 206 and the enable signal DLCTL on line 226. When the pass gate 201 is enabled, the voltage level supplied by the multi-level voltage source 225 is passed onto the main bit line 200. The enable signal DLCTL on line 226 is used for the purpose of controlling the duration of the connection of the multi-level voltage source 225 to the bit line. The multi-level voltage source can be set to a high programming potential, and the application of the programming potential to the bit line is controlled by the contents of the bit latch 206. Also, the multi-level voltage source 225 can be set to VDD, to ground, or to another read potential, and the application of the VDD voltage level to the bit line segment 202 controlled by the contents of the bit latch.

According to another aspect of the invention, the bit latch 206 has a second output on line 230, which is connected to logic 231 to determine whether all the bit latches 206 in the page buffer store the constant value (for program verify) or to determine whether any bit latch 206 in the page buffer stores the constant value (for erase verify). The logic 231 includes one input coupled to each bit latch 206 in the page buffer, as represented by the lines 232. If all of the bit latches 206 store a low constant (at mode 230), then the output of the logic function will be high on line 233 indicating that all bit latches have been reset to the low constant value. If any one of the bit latches has not been reset to the constant value, then the output of the logic function on line 233 will be low, indicating that not all have been reset to the constant value. This logic is useful in program or erase verify situations as described below.

Figure 6:
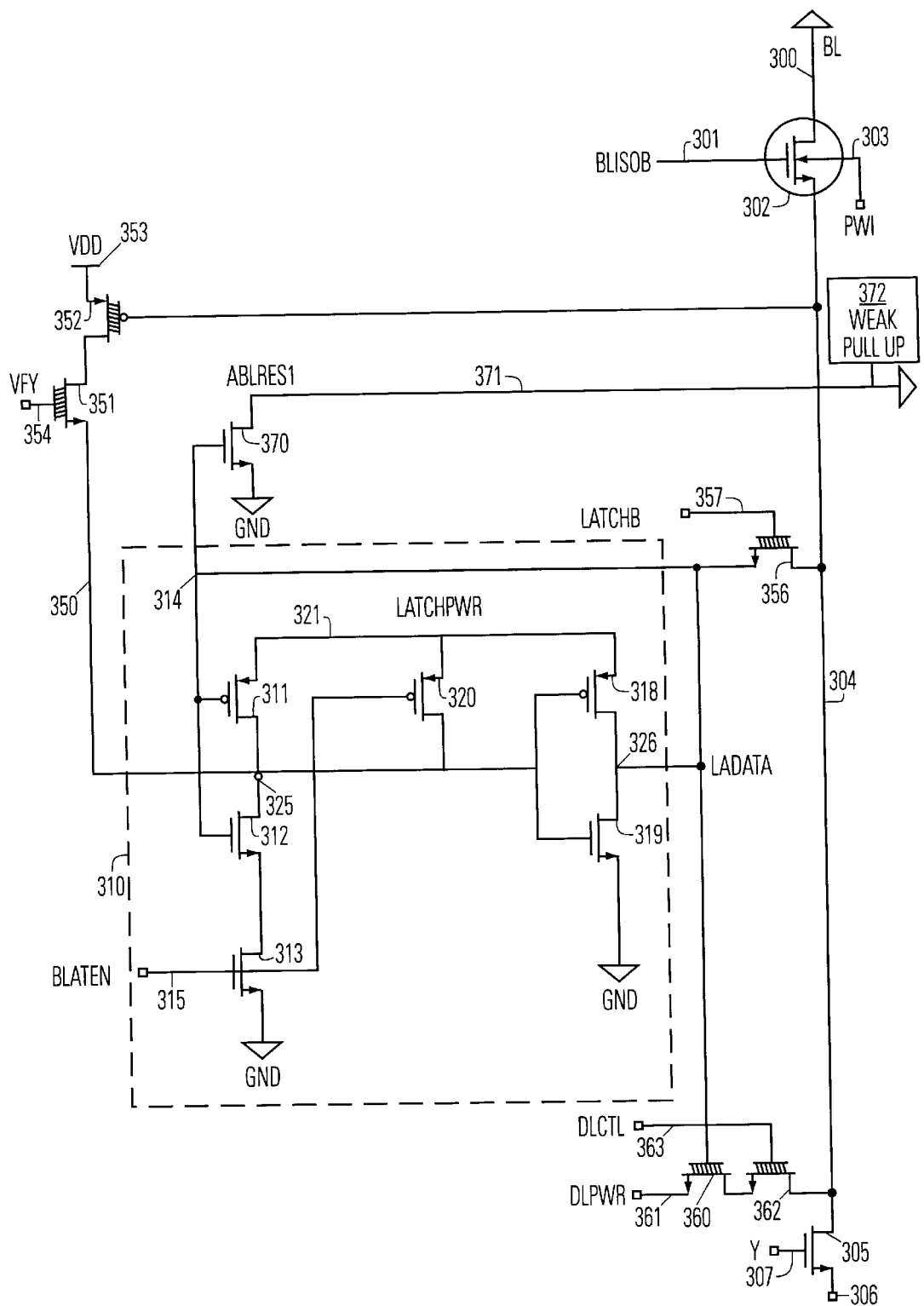
FIG. 6 is a circuit diagram of a preferred embodiment of the bit latch structure according to the present invention.

FIG. 6 provides a detailed circuit diagram of a bit line control element including the bit latch 310, such as illustrated in FIG. 5. Bit line 300 is connected to the source of a triple well NMOS transistor 302. The transistor 302 is formed by creating a n-type well in the substrate, then creating a p-type well within the n-type well and forming an NMOS transistor therein. The size of the triple well NMOS transistor 302 in this example is about 40 microns wide by about 1.2 microns long. The p-well in the structure is biased by a bias-potential PWI on line 303. The gate of the transistor 302 is controlled by the control signal BLISOB on line 301. A bit line segment 304 is connected to the source of the transistor 302. Bit line segment 304 is coupled to the drain of a y-select transistor 305. The y-select transistor 305 in the embodiment illustrated is a basic NMOS device having a width of about 30 microns and a length of about 1.2 microns. Source of the transistor 305 is coupled to the data input/output bus at terminal 306. The gate of transistor 305 is controlled by a y-decode signal Y on line 307.

The bit line control element shown in FIG. 6 includes a bit latch storage element 310, which is a basic SRAM type storage element with an enable circuit. Thus, the storage element 310 includes a first inverter composed of p-channel transistor 311 in series with n-channel transistor 312. The p-channel transistor 311 has a width of about 3 microns and a length of about 1.6 microns in this example. The n-channel transistor 312 has a width of about 3 microns and a length of about 1.2 microns in this example. The enable circuit is coupled to the first inverter by means of n-channel transistor 313, which has its source coupled to the ground terminal. The gates of transistors 311 and 312 are connected to node 314 of the memory element. The drain of transistor 311 and the drain of transistor 312 are coupled to node 325. Also the gate of transistor 313 is connected to the control signal BLATEN on line 315.

The second inverter in the memory element 310 is composed of p-channel transistor 318 and n-channel transistor 319. The p-channel transistor 318 has a width of about 6 microns and length of about 1.2 microns, and the n-channel transistor 319 has a width of about 3 microns and a length of about 1.2 microns in this example. The drain of transistor 318 and the drain of transistor 319 are coupled to node 326. The gates of transistors 318 and 319 are coupled to node 325.

The enable circuit in the memory element 310 also includes a p-channel transistor 320 which in this example has a width of about 3 microns and a length of about 0.8 microns. The source of the p-channel transistor 320 is coupled to the node 321 which supplies the LATCHPWR signal, which corresponds to the Latch Power signal in FIG. 5, which is normally VDD. The latch power level is controlled during operations involving the bit line control element as described below.

The storage element 310 has an output at node 326, which is fed back to node 314 as input to the inverter composed of transistors 311 and 312, and an output at node 325 which is connected to the input of the inverter formed of transistors 318 and 319. The outputs 325, 326 can be considered true and complement versions of the data bit stored in the memory element. In the example illustrated node 326 labeled LADATA is considered the true output. The complement output is generated at node 325.

A first input to the memory element 310 is supplied at node 325 across line 350. Line 350 is connected through a pass gate composed of a native n-channel transistor 351 and native p-channel transistor 352 to a supply of the constant voltage, such as VDD 353. The native p-channel transistor is formed using normal PMOS process without a channel enhancement doping so that the threshold of the device is about minus 1.25 volts. In this example, the width of the device is about 5 microns and the length is about 1 micron. The native n-channel device 351 is formed without channel enhancement doping, and thus has a threshold of about 0.45 volts, which is lower than normal n-channel transistors that have enhancement doping in the channel.

The gate of transistor 352 is connected to bit line segment 304. The gate of transistor 351 is connected to the control signal VFY on line 354.

A second input of the memory element 310 is supplied from bit line segment 304 through the pass transistor 356 which is implemented with an n-channel native device having a width of about 12 microns and a length of about 1.2 microns. The gate of the transistor 356 is connected to the control signal LATCHB on line 357.

A first output of the memory element 310 is supplied from node 326 to the gate of a native n-channel transistor 360. The source of the n-channel transistor 360 is connected to the data line power signal DLPWR generated by a multi-level voltage source at node 361. The drain of transistor 360 is coupled to the source of native n-channel pass transistor 362. The drain of transistor 362 is coupled to the bit line segment 304. The gate of transistor 362 is controlled by the data line control signal DLCTL on line 363. Transistor 360 and transistor 362 are implemented with native NMOS devices having widths of about 4 microns and lengths of about 1.2 microns.

A second output of the memory element 310 is supplied at node 326 as well (through node 314) at the gate of n-channel device 370. The source of n-channel device 370 is coupled to ground while the drain of n-channel device 370 is connected to the ABLRES1 line 371. Transistor 370 is implemented with an NMOS device having a width of about 3 microns and a length of about 0.8 microns. The ABLRES1 signal on line 371 is connected in common with other bit latches in the page buffer to a weak pull-up circuit 372, such that if any one of the signals ABLRES1 on line 371 is pulling down (input high), then ABLRES1 is low, providing a NOR gate function to determine whether all of the bit latches in the page buffer have been reset.

Figure 7:
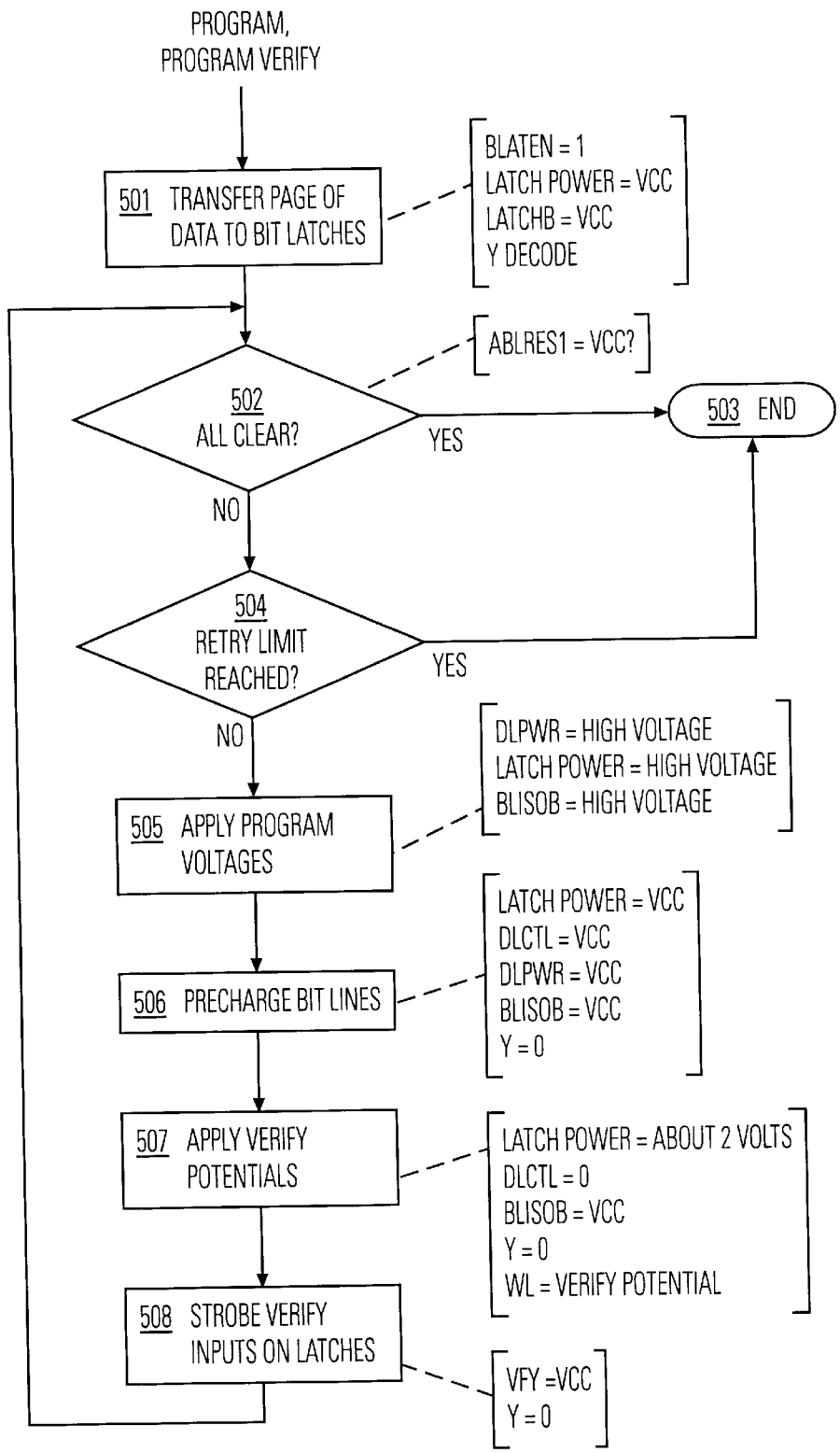
FIG. 7 is a flow chart illustrating the program and program verify operation executed using the bit latches of the present invention.
Figure 8:
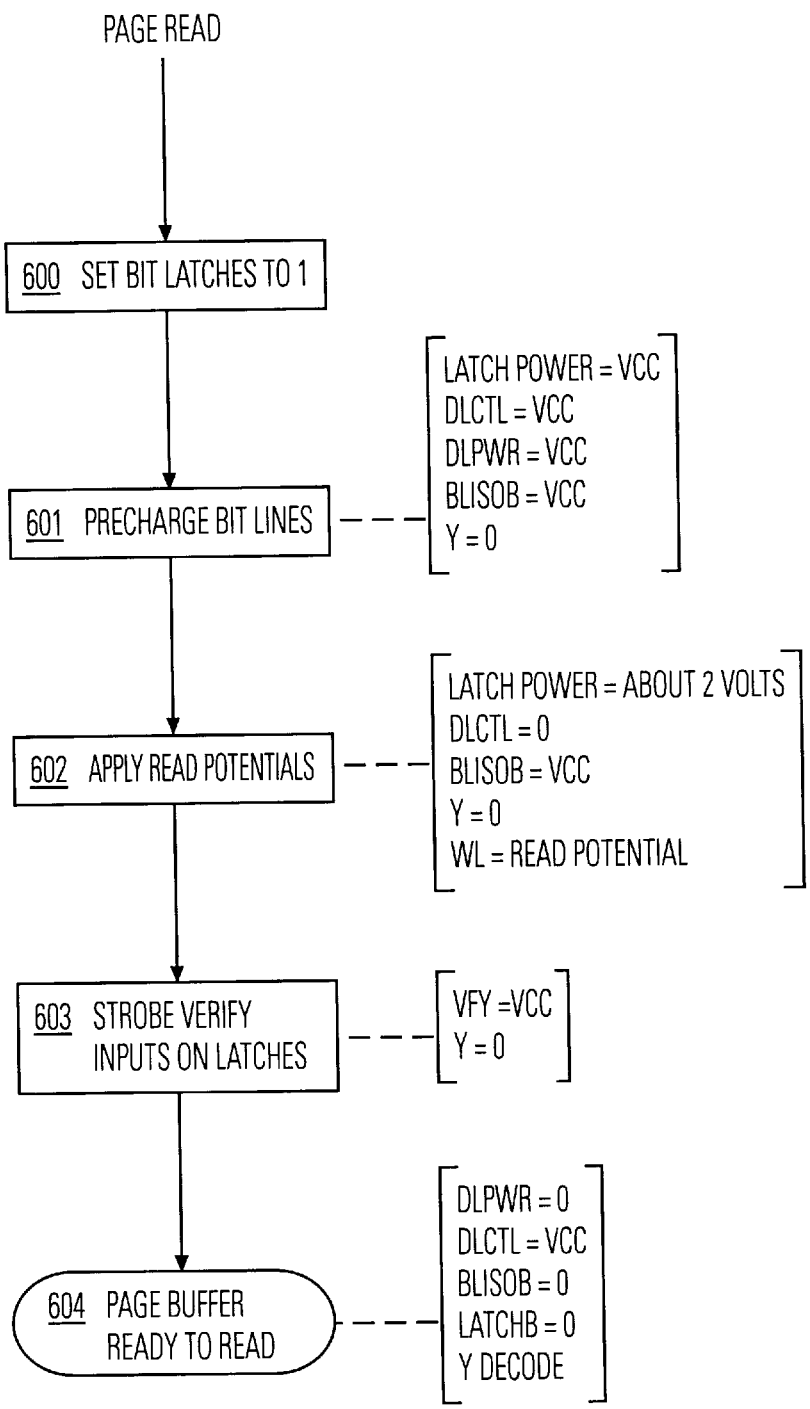
FIG. 8 is a flow chart illustrating the page read process according to the present invention.
Figure 9:
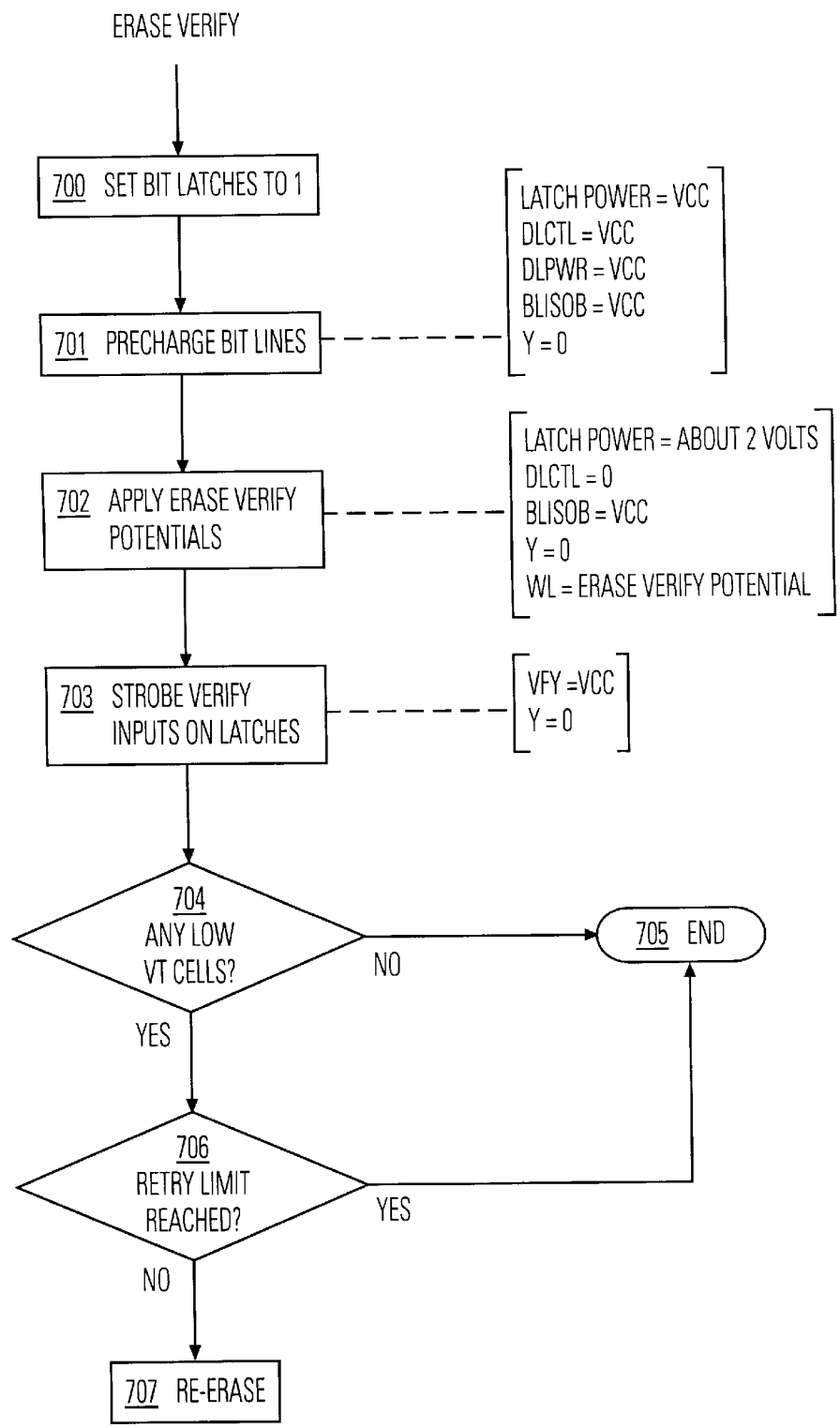
FIG. 9 is a flow chart illustrating a page mode erase verify process according to the present invention.

The low current bit latch structure, such as described in FIGS. 5 and 6, provides the ability to execute efficient page mode program and program verify operations as illustrated in FIG. 7, efficient page read operations as illustrated in FIG. 8, and efficient erase verify operations as illustrated in FIG. 9.

The program and program verify process is described first, referring to FIG. 7. In one embodiment, the program and program verify process begins by loading a page of data into the bit latches in the page buffer (block 501). A page of data in the preferred embodiment is at least 500 bits, and preferably 1K (1024 bits) or more of data. During this process, the bit latches are enabled by the BLATEN signal, the latch power is set to the full supply potential VDD, the LATCHB input is set high, and the Y signal is pulsed per column decode operations, as data is transferred byte-by-byte into the bit latches.

The next step in the process determines whether all of the memory elements in the page buffer have been reset (block 502). This is determined by testing the ABLRES1 signal on line 371. If it is high, then all the bit latches are reset. Else, at least one of the bit latches has not been reset. Thus, if all are reset, then the process is completed with a successful program and verify (or no program is needed) as indicated in block 503. If it is determined at block 502 that at least one of the bit latches remains set, then the algorithm determines whether the program retry limit has been reached (block 504). If the retry limit has been reached, then the process has ended, and an error is indicated. If the retry limit has not been reached, then the algorithm continues to block 505 to apply (or reapply) the programming potential, only to bit lines for which the memory element in the bit latch has not been reset.

In block 505, the program voltages are applied to program the data from the bit latches into the array. In this step, DLPWR on line 361 is set to the program high voltage, the latch power is set to a high voltage, and the control signal BLISOB on line 301 is set to high voltage. This allows the transfer of a high voltage to the bit line 300 if the output of the memory element 310 at node 326 is high by pulsing the DLCTL signal. If the output of the memory element 310 is low, then the high programming voltage is not connected to the bit line.

After the program cycle, the bit lines are pre-charged (block 506). Bit lines are pre-charged using the bit latch structure of the present invention, setting latch power to VDD, the DLCTL control signal on line 363 to VDD, the data line power on line 361 to VDD, the BLISOB signal line 301 to VDD, and by turning off the Y select transistor 305. Thus, the bit line 300 is pre-charged to the VDD level, or about VDD-VT, where VT is NMOS threshold voltage.

After the bit lines are pre-charged, the bit lines are isolated and verify potentials are applied to the array (block 507). The word lines are set to a verify potential. During this step the latch power is decreased to about 2 volts to reduce the amount of power consumed during the verify operation. The DLCTL signal line 363 is set low to isolate the data line power from the bit line, the BLISOB signal line 301 is set high, and the Y select transistor is turned off. After applying the verify potentials, the verify inputs are strobed (block 508). This occurs by strobing the VFY control signal on line 354. In this operation, the Y select transistor remains turned off. If when the VFY signal is strobed, the voltage on the bit line at node 301 is low enough to turn on transistor 352, then the VDD potential is applied to node 325 of the memory element 310. This results in resetting the memory element so that the output on line 326 is low. If the accessed cell on the bit line has a low threshold, then the pre-charged bit line is discharged through the cell, and the voltage level on the bit line falls below the turn on threshold of the transistor 352. In this way, the memory element 310 does not fight for current on the bit line, and relatively high speed verify operation is achieved.

After strobing the verify inputs on the bit latches in block 508, the process loops to block 502 to retry programming of cells which fail verify, for a threshold number of retries.

The bit latch structure also allows for an efficient page read operation as illustrated in FIG. 8. In this operation, the algorithm begins by setting all of the bit latches to a constant value, such that the output on line 326 is high (block 600). One technique for setting all of the bit latches high in parallel can be achieved by turning on all of the Y select transistors 307 for all bit lines. The latch power level on line 321 is decreased to about 1 volt. The data is supplied on node 306 at VDD, and the LATCHB signal line 357 is set to VDD. This way, the data value is transferred to the input 314 of the latch. At that point, the latch power is slowly powered up to latch the data into the cell with the relatively low current parallel operation. Alternatively, the bit latches can be set byte-by-byte, relying on the column decoding operation in a manner similar to loading into the bit latches.

After all bit latches have been pre-set, the algorithm proceeds to a verify procedure which is based on first a pre-charge of the bit line (block 601). This pre-charge is accomplished using the same control signals as is described for block 506 of FIG. 7. After pre-charging the bit lines, read potentials are applied to the word lines (block 602). Again, control signals for this process are similar to those as applied during block 507 of FIG. 7. After applying read potentials, the verify inputs on the bit latches are strobed (block 603). This is similar to the operation of block 508 of FIG. 7. After strobing the verify inputs, the control bits stored in the bit latches are ready for reading through data input/output bus of integrated circuit (block 604). This process is executed by setting the DLPWR value to ground, setting the DLCTL value to VDD, setting the BLISOB signal to ground and the LATCHB signal to ground. The Y transistors are pulsed in response to the column decoding operation. Thus, if a bit latch has been reset, then the output LADATA on line 326 will be low, preventing the connection of ground to the bit line segment 304. However, if it has not been reset, then the high value stored in the memory element will couple ground to the bit line segment 304 which will be transferred to the sense amplifiers. High speed page access is achieved due to low capacitance loading between the bit latch and the sense amplifiers (bit lines isolated), and high current available from the bit latch. Optionally, data can be loaded into the SRAM cache for a more flexible interface.

Thus, a page mode read is provided, in which the first byte is available after the process of FIG. 8 is executed, which takes on the order of a microsecond, depending on the bit line settling times and the like. However, all subsequent bytes in the page can be read at the SRAM-like speed, which is much faster than normal reads to floating gate memory arrays. For example, typical read time for a floating gate memory array is about 100 nanoseconds, while the typical read time from a bit latch is on the order of 50 nanoseconds or less. With a 128 byte page buffer, read in parallel, the first byte will be available in about 1 microsecond (the equivalent of reading 10 bytes from the array directly), and all of the following 127 bytes are available for reading with 50 nanosecond access times, either sequentially, or randomly from the bit latch. Overall throughput is increased using the page read process as illustrated in FIG. 8.

FIG. 9 provides an example erase verify operation using the low current bit latch. The process begins after an erase operation, which in the embodiment described is based on charging the floating gates of a block of memory cells in the array, to establish a high threshold voltage state for all of the erased cells. After the erase, the bit latches are set to the constant value of 1 (block 700), using a technique such as that described with reference to block 600 of FIG. 8. Next, the bit lines are pre-charged (block 701). Again, this is similar to the process described with reference to block 506 of FIG. 7. After pre-charging the bit lines, erase verify potentials are applied to the word lines (block 702). This is similar to the process described with reference to block 507 of FIG. 7, except that erase verify potentials are applied to the word lines. These potentials are near VDD, such as for example 4.5 volts, to establish an erase verify margin. After applying erase verify potentials, the verify inputs on the bit latches are strobed (block 703), such as described with reference to block 508 of FIG. 7. After strobing the bit latches, the algorithm proceeds to determine whether any low threshold cells were detected (block 704). A low threshold cell would result in resetting of the bit latch. Thus, it is necessary to determine whether any one bit latch has been reset, the opposite operation to determining whether all bit latches have been reset as described with reference to block 502 of FIG. 7. This can be accomplished by a read process in which the bit latches are read byte-by-byte in through the column decoder. Alternatively, logic can be used to sense the output of the bit latches in parallel for example, using a NOR function to determine whether one cell has been reset.

If there were no low threshold cells detected, then the process is finished as indicated in block 705. If a low threshold cell was detected, then the algorithm determines whether a retry limit had been reached (block 706). If the retry limit is reached, then the process is finished at block 705, and an error is indicated. If the retry limit had not been reached, then a re-erase operation is executed (block 707).

The bit latch structure of FIG. 6 may be modified to use an n-channel transistor in place of the p-channel transistor 352. In the n-channel scheme, transistors 352, 351, and 370 are connected to node 326, and the source of transistor 352 is grounded. The gate of the transistor 352 (n-channel in this embodiment) is connected to the bit line segment 304. The n-channel approach is particularly well suited for the erase verify sequence. For example, an erase verify sequence would include the following steps:

1) Preset all of the bit latches so that node 326 stores a high level.
2) Precharge all of the bit lines to a high level.
3) Apply a voltage level to the word line for erase verify.
4) For those erased high threshold cells, the bit line will remain high, when the verify potential is strobed. This causes node 326 to be reset to zero. If a low threshold cell exists, then the bit line is discharged to ground through the cell, and the bit latch node 326 associated with the low threshold cell remains at the preset high value. Node 371 is then pulled down to trigger another retry pulse.

Accordingly, bit line control element structure is provided which supports a parallel program and program verify algorithm, a page mode read, and a page mode erase verify. This structure can help solve excess current and power crash problems associated with a highly parallel operation on a latch structure, bit line coupling noise which might occur between bit lines during the parallel operation, and the bit line discharge time associated with the verify operations. The excess current and power crash problem is solved by providing the capability control the power level on the memory element in the bit latches. Thus, at appropriate times the bit latch power is reduced to reduce the current consumption of the device. The bit line coupling problem caused by capacitive coupling between adjacent bit lines, can be solved by even and odd bit line logic, so that two sets of control signals are used for strobing the VFY signal and the DLCTL signal in the structure of FIG. 6. By alternate strobing, neighboring bit lines are not sensed at the same time, so that fringing capacitance between them will not cause unwanted disturbance.

The bit line discharge time depends on the bit line capacitance and the cell discharge current. However, because the bit line is isolated from the bit latch during the verify process, discharge time is not complicated by fighting for current consumption against the bit latch structure. Thus a calculated fixed time can be used by the state machine executing the verify process. Alternatively, a small current source, such as a reference floating gate cell, can be used to discharge a reference bit line capacitor and to generate a timeout signal in response to detecting the level on the reference bit line capacitor. This reference bit line capacitor approach provides more chip specific verify timing than possible using a calculated fixed time.

Also, the same bit latch is used for a page mode read operation. Conventional flash memory read operations are random access and relatively slow. However, a high speed page mode read access can be executed as discussed above using the unique bit latch of the present invention.

Finally, a page mode erase verify process is described which can be used to speed up the erase operation in a flash memory device.

The present invention has been described primarily with reference to a memory cell in which the flash erased state is defined as a high threshold for the floating gate memory cells, and a programmed state is defined as a low threshold. However, the present invention can be applied if the flash cell is defined as erased when it has a low threshold, and programmed when it has a high threshold.

The foregoing description of preferred embodiments of the invention has been presented for purposes of illustration and description. It is not intended to be exhaustive or to limit the invention to the precise forms disclosed. Many modifications and variations from the precise forms disclosed are possible. It is intended that the scope of the invention be defined by the following claims and their equivalents.

What is claimed is:

1. In an array of floating gate memory cells including sets of floating gate cells and a buffer which can be coupled with a set of floating gate cells among the sets, a method of loading data into a selected portion of the set of floating gate cells, the method comprising:

storing contents of the set of floating gate cells into the buffer;

storing the data into a portion of the buffer corresponding to the selected portion of the set of floating gate cells; and storing contents of the buffer into the set of floating gate cells.

2. The method of claim 1, wherein the set comprises a row of cells.

3. The method of claim 1, wherein the data comprises a byte.

4. The method of claim 1, wherein the data comprises at least 4 bits and not more than 128 bits.

5. The method of claim 1, wherein the set comprises at least 500 bits.

6. The method of claim 3, wherein the set comprises at least 500 bits.

7. The method of claim 4, wherein the set comprises at least 500 bits.

8. The method of claim 1, wherein the buffer comprises static random access memory (SRAM).

9. The method of claim 1, wherein the buffer comprises bit latches coupled to respective bit lines and the set of floating gate cells comprises a row of floating gate cells.

10. The method of claim 9, wherein storing the contents of the row into the buffer comprises:

setting a set of bit lines to a pre-charge voltage level;

applying a word line voltage to a word line of the row; and responding to changes in voltage levels of the bit lines in response to the word line voltage, to store a constant in the bit latches coupled to the bit lines on which the voltage levels of the bit lines passes a threshold during the step of applying the word line voltage.

11. The method of claim 9, wherein storing contents of the buffer into the row comprises:

erasing the row;

applying a word line voltage to a word line of the row; and applying a programming potential to a set of bit lines in response to one binary value in the bit latches, but not the other binary value.

12. The method of claim 11, wherein storing contents of the buffer into the row further comprises:

verifying that the row has been successfully programmed.

13. The method of claim 1, comprising:

before the storing the data into the portion of the buffer, storing the data into a register coupled to the buffer; and wherein storing the data into a portion of the buffer comprises causing the data in the register to be stored into the buffer.

14. In an array of floating gate memory cells including bit lines coupled with corresponding columns of cells in the array, word lines coupled with corresponding rows of cells in the array, and bit latches coupled with respective bit lines, a method of loading data into a selected portion of row in the array, the method comprising:

storing contents of the row of floating gate cells into the bit latches;

storing the data into a set of the bit latches corresponding to the selected portion of the row in the array of floating gate cells; and storing contents of the bit latches into the row in the array of floating gate cells.

15. The method of claim 14, wherein the row of floating gate cells comprises at least 500 cells and the data comprises not more than 256 bits.

16. The method of claim 15, comprising:

before the storing the data into the set of bit latches, storing the data into a register coupled to the bit latches; and wherein the storing the data into a portion of the buffer comprises causing the data in the register to be stored into bit latches corresponding to the selected portion of the row.

17. The method of claim 16, wherein causing the data in the register to be stored into bit latches corresponding to the selected portion of the row comprises:

coupling a multiplexer between the register and the bit latches; and applying to the multiplexer a portion of an address of the selected location in the array, the portion of the address corresponding to the selected portion of the row.

18. The method of claim 16, wherein storing contents of the row into the bit latches comprises:

resetting a bit line address; and setting a word line corresponding to the row.

19. The method of claim 18, wherein storing contents of the bit latches into the row comprises:

erasing the row; and programming cells in the row based on contents of the bit latches.

20. The method of claim 19, wherein programming the row based on contents of the bit latches comprises applying a programming potential to the bit lines in response to the contents of the bit latches.

21. The method of claim 20, wherein the programming potential comprises greater than 5 volts.

22. The method of claim 20, wherein applying a programming potential comprises providing pass transistors, having gate terminals, between a supply of the programming potential and the bit lines, and connecting outputs of respective bit latches to gate terminals of the pass transistors.

23. The method of claim 20, wherein applying a programming potential includes first applying the programming potential to bit lines in a first set of bit lines among the bit lines, and then applying the programming potential to bit lines in a second set of bit lines among the bit lines.

24. The method of claim 23, bit lines in the first set of bit lines comprising every other bit line and bit lines in the second set of set of bit lines comprising the remaining bit lines.

25. The method of claim 20, wherein storing contents of the bit latches into the row further comprises:
    verifying that the row has been programmed according to the contents of the bit latches; and
    if the row has not been programmed according to the contents of the bit latches, then reprogramming the row based on the contents of the bit latches.

26. In an array of floating gate memory cells including a buffer which can be coupled with respective sets of bytes of the array, a method of loading a byte into the array at a particular address, the method comprising:
    storing the byte into a register;
    storing a set of bytes from a portion of the array into the buffer, the portion of the array corresponding to a part of the address;
    storing the byte from the register into a location of the buffer, the location corresponding to another part of the address; and
    storing contents of the buffer into the portion of the array.

27. The method of claim 26, wherein the portion of the array comprises a row of cells.

28. The method of claim 26, wherein the array includes word lines coupled to respective rows of cells, the set of bytes comprises a row of cells, and storing the set of bytes from a portion of the array comprises applying a word line voltage to a word line corresponding to the row of cells.

29. The method of claim 26, wherein storing the byte from the register into a location of the buffer comprises:
    coupling a multiplexer between the register and the buffer; and
    applying to the multiplexer the another part of the address.

30. The method of claim 26, wherein storing contents of the buffer into the portion of the array comprises:
    erasing the portion of the array;
    programming bits in the portion of the array based on the contents of the bit latches.

31. The method of claim 26, wherein programming the portion of the array based on the contents of the bit latches comprises:
    in response to the contents of the buffer, applying a programming potential to bit lines coupled to the buffer.

32. The method of claim 31, wherein the programming potential comprises greater than 5 volts.

33. The method of claim 31, wherein applying a programming potential comprises providing pass transistors, having gate terminals, between a supply of the programming potential and the bit lines, and connecting respective outputs of the buffer to gate terminals of the pass transistors.

34. The method of claim 31, wherein applying a programming potential includes first applying the programming potential to bit lines in a first set of bit lines among the bit lines, and then applying the programming potential to bit lines in a second set of bit lines among the bit lines.

35. The method of claim 34, bit lines in the first set of bit lines comprising every other bit line and bit lines in the second set of set of bit lines comprising the remaining bit lines.

36. The method of claim 27, wherein storing contents of the buffer into the portion of the array comprises:
    verifying that cells in the portion have been programmed according to the contents of the buffer; and
    if the cells in the portion have not been programmed according to the contents of the buffer, then reprogramming the portion based on the contents of the buffer.

37. An integrated circuit comprising:
    an array of floating gate memory cells including bit lines coupled with corresponding columns of cells in the array, word lines coupled with corresponding rows of cells in the array; and bit latches coupled with respective bit lines, respective rows including pluralities of bytes;
    a register including at least a byte of storage and less storage than the bit latches;
    a multiplexer coupled to the register and the bit latches; and
    circuitry to control the word lines, the bit latches, and the multiplexer to store data into the register, to select a row of the array, to store the selected row from the array into the bit latches, to store the data from the register into selected bit latches from among the bit latches, and to store contents of the bit latches into the selected row of the array.

38. The integrated circuit of claim 37, comprising:
    circuitry to erase cells in the selected row of the array; and
    circuitry to program particular cells in the selected row of the array based on contents of the bit latches.

39. The integrated circuit of claim 38, the circuitry to program particular cells in the selected row of the array comprises:
    circuitry to, in response to the contents of the bit latches, apply a programming potential to bit lines among the bit lines in the array.

40. The integrated circuit of claim 39, wherein the programming potential comprises greater than 5 volts.

41. The integrated circuit of claim 39, comprising pass transistors, having gate terminals, between a supply of the programming potential and the bit lines, and circuitry to connect respective outputs of the bit latches to gate terminals of the pass transistors.

42. The integrated circuit of claim 39, comprising circuitry to first apply the programming potential to a first set of bit lines among the bit lines, and then apply the programming potential to a second set of bit lines among the bit lines.

43. The integrated circuit of claim 42, bit lines in the first set of bit lines comprising every other bit line and bit lines in the second set of set of bit lines comprising the remaining bit lines.

44. The integrated circuit of claim 37, comprising circuitry to
    verify that the row has been programmed according to the contents of the bit latches; and
    if the row has not been programmed according to the contents of the bit latches, then reprogram the row based on the contents of the bit latches.

* * * * *